(12) United States Patent
Chiu et al.

(10) Patent No.: US 12,017,841 B2
(45) Date of Patent: *Jun. 25, 2024

(54) SUBSTRATE CONTAINER SYSTEM

(71) Applicant: Gudeng Precision Industrial Co., LTD, New Taipei (TW)

(72) Inventors: Ming-Chien Chiu, New Taipei (TW); Chia-Ho Chuang, New Taipei (TW); Kuo-Hua Lee, New Taipei (TW); Shu-Hung Lin, New Taipei (TW); Hao-Kang Hsia, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 521 days.

This patent is subject to a terminal disclaimer.

(21) Appl. No.: 17/363,328

(22) Filed: Jun. 30, 2021

(65) Prior Publication Data

US 2021/0323756 A1  Oct. 21, 2021

Related U.S. Application Data

(63) Continuation-in-part of application No. 16/872,392, filed on May 12, 2020, now Pat. No. 11,508,594.

(30) Foreign Application Priority Data

Jul. 13, 2019  (TW) .................. 108124813

(51) Int. Cl.
- *B65D 81/18* (2006.01)
- *B65D 85/30* (2006.01)
- *H01L 21/673* (2006.01)

(52) U.S. Cl.
CPC ............. *B65D 85/30* (2013.01); *B65D 81/18* (2013.01); *H01L 21/67379* (2013.01); *H01L 21/67389* (2013.01)

(58) Field of Classification Search
CPC ...................................................... B65D 81/18
See application file for complete search history.

(56) References Cited

U.S. PATENT DOCUMENTS

| 2020/0020549 A1 | 1/2020 | Ogawa et al. |
| 2021/0111048 A1 | 4/2021 | Narita et al. |

FOREIGN PATENT DOCUMENTS

| CN | 110870056 A | 3/2020 |
| JP | 2021-15979 | 2/2021 |

(Continued)

OTHER PUBLICATIONS

Taiwan Intellectual Property Office, search report.

*Primary Examiner* — Saul Rodriguez
*Assistant Examiner* — Willie W Berry, Jr.
(74) *Attorney, Agent, or Firm* — WPAT, PC

(57) ABSTRACT

A substrate container including a container body, a filter member, a back cover is provided. The container body having a top face, a bottom face opposing the top face, a back plate of a first height connecting the top face and the bottom face, a front opening located between the top face and the bottom face, and a back opening opposing the front opening. The front opening enables passage of a substrate and the back opening is located on the back plate and has a smaller second height. The filter member covers the back opening. The back cover establishes sealing engagement with the container body. A gas guiding channel extending in a direction of the first height is formed between the back cover and the container body. The back cover and the filter member define a buffering compartment, and the gas guiding channel has an outlet connecting the buffering compartment.

14 Claims, 14 Drawing Sheets

(56) References Cited

FOREIGN PATENT DOCUMENTS

| JP | 2021-32415 | 3/2021 |
|---|---|---|
| TW | 202102416 A | 1/2021 |

SUBSTRATE CONTAINER SYSTEM

RELATED APPLICATIONS

This application is a continuation-in-part of U.S. patent application Ser. No. 16/872,392, by CHIU, et al., titled "SUBSTRATE CONTAINER SYSTEM," filed May 12, 2020, which is hereby incorporated by reference herein in their entirety.

BACKGROUND OF THE INVENTION

Technical Field

This present disclosure relates to transportable container suitable for keeping delicate objects, e.g., a wafer, from environmental contamination during storage, transport, and shipment, and, in particular, to container system capable of evenly distributing purging gas within the container system.

Description of Related Art

Delicate work pieces (e.g., wafers, photo mask/reticles) are subjected to numerous fabrication steps through multiple processing equipment during modern semiconductor manufacturing processes before integrated circuits can be manufactured. The wafers are often transported or shipped from a wafer manufacturing facility to another site where they are further processed. The relocation of such delicate devices is often done through dedicated substrate containers, such as FOUPs (front opening unified pods).

Front opening unified pods (FOUPs) are often used for containing 300 mm or 450 mm wafers between processing stations. FOUPs conventionally have a shell that defines an open interior and shelves in the shell for holding a spaced stack of wafers. Moreover, the shell defines a front opening that is coverable by a front door member, which incorporates a sealing member and a latch mechanism to establish hermetical engagement between the door and the shell.

It is desirable to control the intrusion of ambient contaminant (e.g., air/dust/moisture) into the substrate container during the insertion or removal of substrates (e.g., when the front door is removed and the interior is exposed). The intrusion of ambient contaminant into the pod can adversely affect the yield of the resident substrates, even when the ambient environment is that of a clean room. To this end, purging equipment is incorporated into the carrying pod system to support a purging process during loading/unloading of the pod payload.

SUMMARY

In view of the above-mentioned problems, the present invention is to provide a substrate container system, in which, a back opening with a height smaller than that of a back plate of a container body is formed on the back plate, and the back opening is covered by a filter member. As a result, the filter member provides a purging gas in a partial, non-full-surface manner.

According to one aspect of the invention, a substrate container system includes a container body, a filter member, and a back cover. The container body has a top face, a bottom face opposing the top face, a back plate of a first height connecting the top face and the bottom face, a front opening that is located between the top face and the bottom face, and a back opening opposing the front opening. The front opening enables passage of a substrate. The back opening is located on the back plate and has a second height smaller than the first height. The filter member covers the back opening. The back cover establishes sealing engagement with the container body. A gas guiding channel extends in a direction of the first height and is formed between the back cover and the container body. The back cover and the filter member cooperatively define a buffering compartment. The gas guiding channel has an outlet connecting to the buffering compartment.

In one embodiment, the second height is about 10% to about 90% of the first height.

In another embodiment, the second height is about 10% to about 50% of the first height, and the back opening is in proximity to the top face.

In yet another embodiment, the filter member has a gas dispensing surface whose area is larger than that of the back opening, and the gas dispensing surface has a plane parallel to the back plate.

In a further embodiment, the filter member has a gas dispensing surface whose area is larger than that of the back opening, and the gas dispensing surface has a plane forming an acute angle with the back plate.

In another embodiment, the filter member has a gas dispensing surface whose area is larger than that of the back opening, and the gas dispending surface has a wavy surface.

In yet another embodiment, the filter member has a gas dispensing surface whose area is larger than that of the back opening, and the gas dispensing surface extends towards the container body through the back opening and forms a curved profile.

In a further embodiment, the filter member has a gas dispensing surface whose area is larger than that of the back opening, and the gas dispensing surface extends towards the back cover through the back opening and forms a curved profile.

In another embodiment, the back cover has several ribs protruding towards the container body for abutting against the filter member, and the ribs are disposed intermittently to form several grooves that constitute a part of the outlet of the gas guiding channel.

In yet another embodiment, the substrate container system further includes a sealing member having a first seal ring portion and a second seal ring portion. The first seal ring portion is arranged between the back cover and the container body. The second seal ring portion is arranged between the filter member and the container body.

In a further embodiment, the back cover includes a gas inlet structure bendingly extending under the bottom face of the container body. The gas inlet structure includes a gas intake port facing downwardly and opposing the bottom face of the container body for connecting an external purging apparatus.

In another embodiment, the substrate container system further includes a valve assembly enabling passage of a purging gas. The gas intake port has a connecting structure through which the valve assembly is connected to the gas intake port.

In a further embodiment, the valve assembly includes a valve body and a first elastic material. The first elastic material is disposed at one side of the valve body. The first elastic material has a fin that deforms when the valve assembly is assembled with the connecting structure to establish sealing engagement with the connecting structure.

In yet a further embodiment, the valve assembly further includes a second elastic material. The second elastic material is disposed at another side of the valve body. The second elastic material has a docking surface for connecting to the external purging apparatus to establish sealing engagement.

According to the disclosure of the embodiments of the invention, the back plate has the first height and the back opening has the second height that is smaller than the first height, and the filter member covers the back opening. As a result, the purging gas can be provided in a partial, non-full-surface manner, and thus the flow rates are different at different heights in the internal space of the container body. During the insertion or removal of the substrates relative to the container body, the outside contaminants such as dust, particles, and moisture will not enter the internal space of the container body with the air outside the front door, thus the cleanliness can be maintained and the humidity rising can be reduced.

BRIEF DESCRIPTION OF DRAWINGS

The invention can be more fully understood by reading the following detailed description of the embodiment, with reference made to the accompanying drawings as follows:

FIG. 14b is a side view of the filter member of FIG. 14a

FIG. 15b is a side view of the filter member of FIG. 15a;

FIG. 16b is a side view of the filter member of FIG. 16a;

DETAILED DESCRIPTION

Figure 1:
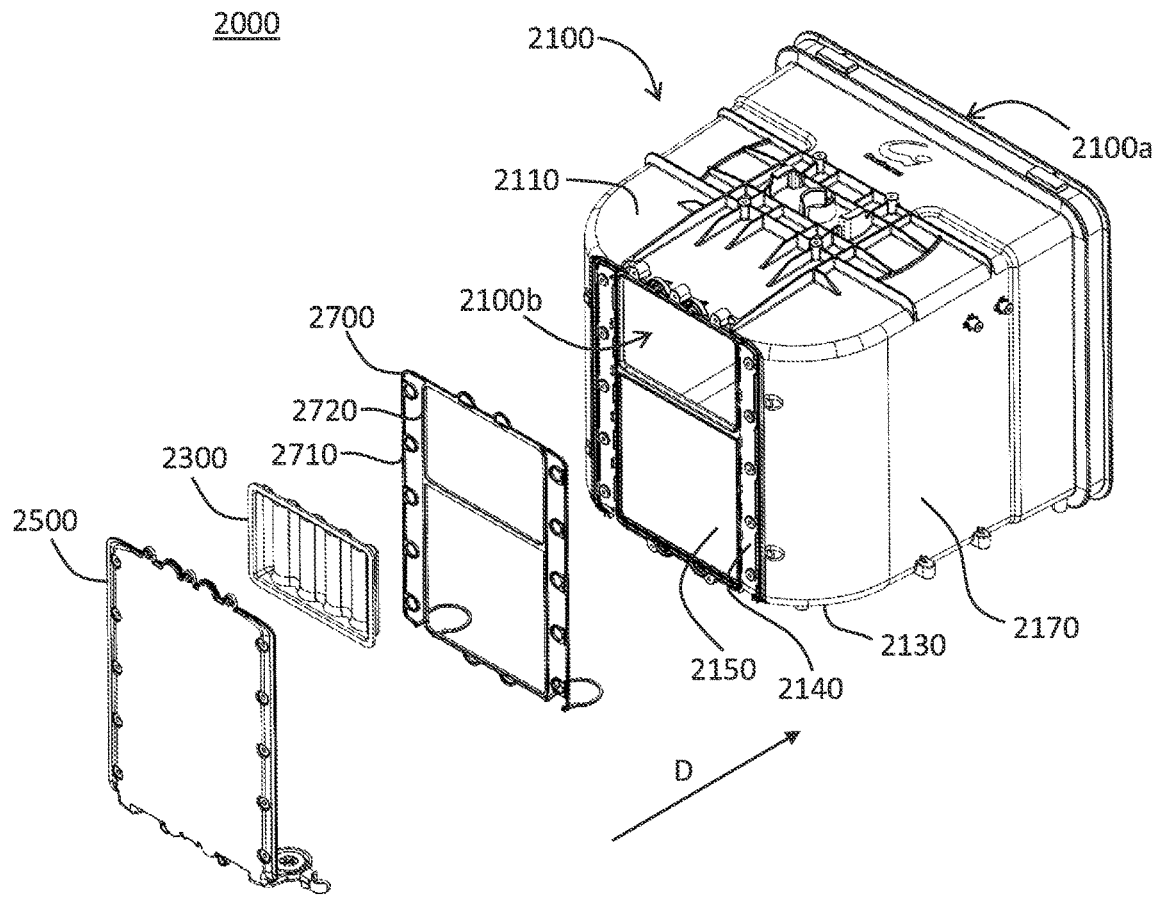
FIG. 1 is a three-dimensional exploded view of a substrate container system according to one embodiment of the invention.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

According to the embodiments of the invention, the back plate of the container body has a back opening, and the back opening provides the purging gas in a partial, non-full-surface manner, so the flow rates of the purging gas are different at different heights in the internal space of the container body. The outside contaminants such as dust, particles, and moisture can be prevented from entering the internal space of the container body with the air outside the front door, thus the cleanliness can be maintained and the humidity rising can be reduced. The description will be made as to the exemplary embodiments in conjunction with the accompanying drawings in FIGS. 1 to 25. In the figures, depicted elements are not necessarily shown to scale and some elements or structures are omitted to clearly display the technical features of the present invention.

Figure 2:
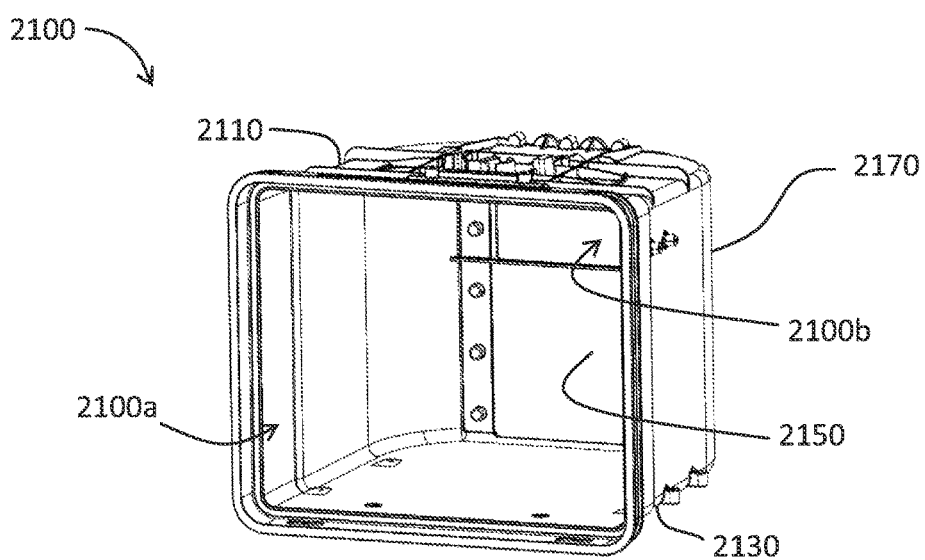
FIG. 2 is a three-dimensional view of the container body of FIG. 1.

Please refer to FIG. 1 and FIG. 2 at the same time. FIG. 1 is a three-dimensional exploded view of a substrate container system according to one embodiment of the invention, and FIG. 2 is a three-dimensional view of the container body of FIG. 1. The substrate container system 2000 of the present embodiment includes a container body 2100, a filter member 2300, and a back cover 2500. The substrate container system 2000 is exemplified by a front opening unified pod (FOUP). The container body 2100 includes a top face

2110, a bottom face 2130 opposing the top face 2110, and a back plate 2150 connecting the top face 2110 and the bottom face 2130. The container body 2100 further includes a front opening 2100*a* and a back opening 2100*b*. The front opening 2100*a* is located between the top face 2110 and the bottom face 2130 and enables passage of a substrate. The substrate container system 2000 also includes a front door (not shown) including a latching mechanism and an air-tight member. When the front door covers the front opening 2100*a* and is locked with the container body 2100, an internal space that is air-tight is formed between the front door and the container body 2100. The internal space is used for accommodating reticles, wafers, or other substrates having high cleanliness requirements.

In the present embodiment, the container body 2100 is made of plastic and is integrally formed in one piece. The container body 2100 includes two lateral sidewalls 2170 disposed between and connecting the top face 2110 and the bottom face 2130. The two lateral sidewalls 2170 respectively disposed one two opposing sides of the back plate 2150. Generally, the container body 2100 forms a box composed of the top face 2110, the bottom face 2130, the two lateral sidewalls 2170, and the back plate 2150 for accommodating the substrate. The front opening 2110*a* is surrounded by the top face 2110, bottom face 2130, and the two lateral sidewalls 2170, and the height and width of the front opening 2100*a* is larger than that of the back opening 2100*b*.

Figure 3:
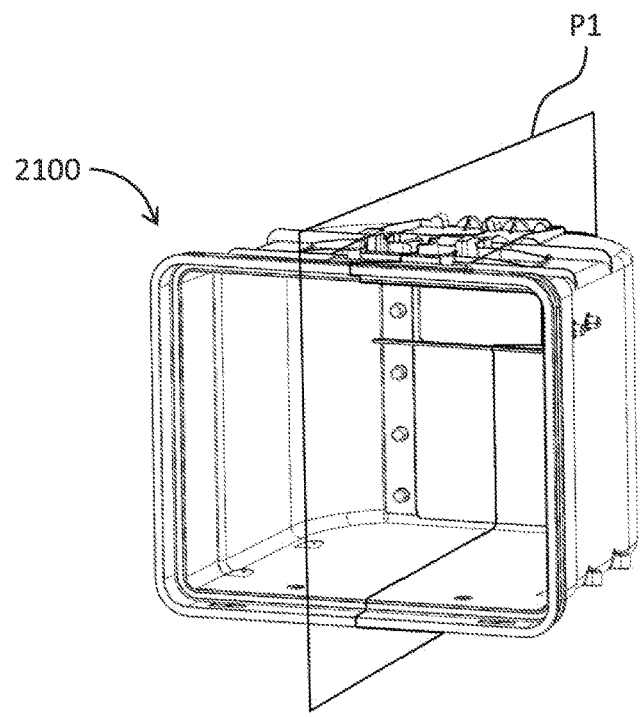
FIG. 3 is a schematic diagram of the container body of FIG. 2 and section P1.
Figure 4:
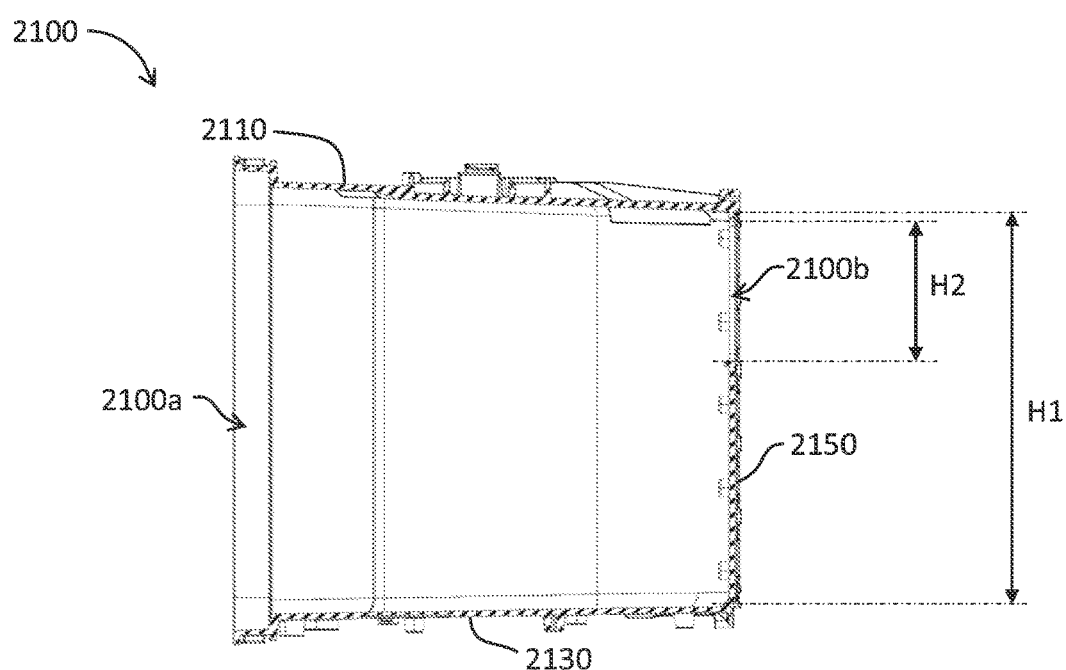
FIG. 4 is a cross-sectional view of the container body along section P1.

Please refer to FIG. 3 and FIG. 4 at the same time. FIG. 3 is a schematic diagram of the container body 2100 of FIG. 2 and section P1, and FIG. 4 is a cross-sectional view of the container body 2100 along section P1. The back opening 2100*b* is located on the back plate 2150 and is opposing the front opening 2100*a*. The back plate 2150 has a first height H1, and the back opening 3200*b* has a second height H2 smaller than the first height H1. The interval between the top face 2110 and the bottom face 2130 gradually gets smaller from the front opening 2100*a* to the back opening 2100*b* and is at its smallest at the back plate 2150. The back plate 2150 connects the top face 2110 and bottom face 2130, and the first height H1 of the back plate 2150 approximately equals the height of the container body 2100 here. The second height H2 of the back opening 2100*b* is smaller than the first height H1 of the back plate 2150, which means the back opening 2100*b* does not fully occupy the whole back plate 2150. The back opening 2100*b* is not formed in a full-surface manner; instead, it is formed in a non-full-surface manner.

According to the above description, the second height H2 of the back opening 2100*b* is smaller than the first height H1 of the back plate 2150. In one embodiment, the second height H2 is about 10% to about 90% of the first height H1. In a further embodiment, the second height H2 is about 10% to 50% of the first height H1, and the back opening 2100*b* is in proximity to the top face 2110.

Figure 5:
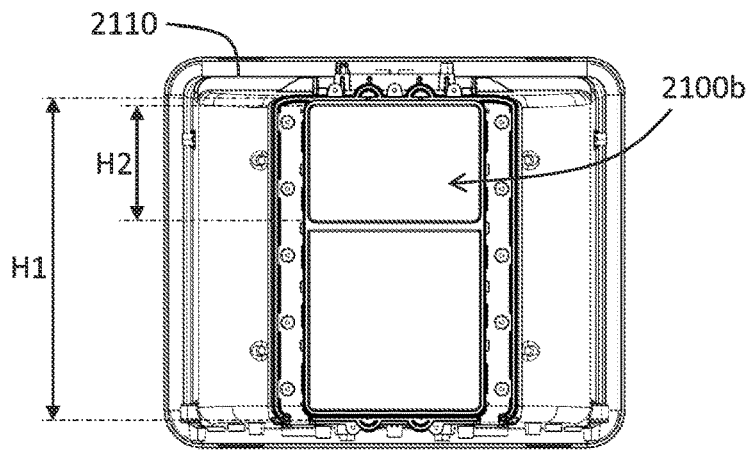
FIG. 5 is a rear view of the container body of FIG. 3.

Please refer to FIG. 5, which is a rear view of the container body of FIG. 3. In the embodiment of FIG. 5, the second height H2 is about 40% of the first height H1, and the back opening 2100*b* is in proximity to the top face 2110; that is, the back opening 2100*b* situates in an upper location that is near the top face 2110 in the height direction.

Figure 6:
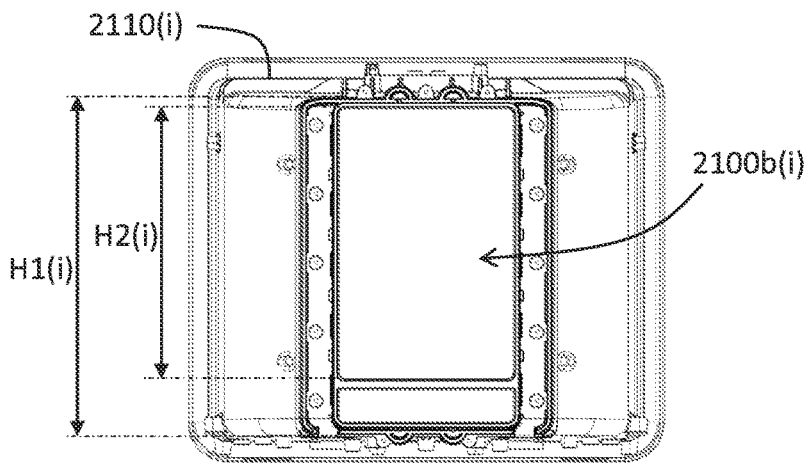
FIG. 6 is a rear view of a container body according to another embodiment of the invention.

FIG. 6 is a rear view of a container body according to another embodiment of the invention. In the embodiment of FIG. 6, the second height H2(*i*) is about 90% of the first height H1(*i*), and the back opening 2100*b*(*i*) is in proximity to the top face 2110(*i*).

Figure 7:
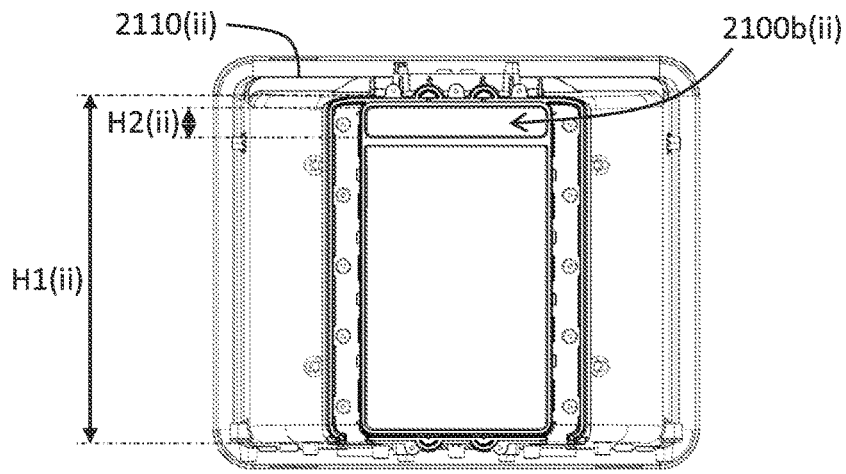
FIG. 7 is a rear view of a container body according to yet another embodiment of the invention.

FIG. 7 is a rear view of a container body according to yet another embodiment of the invention. In the embodiment of FIG. 7, the second height H2(*ii*) is about 10% of the first height H1(*ii*), and the back opening 2100*b*(*ii*) is in proximity to the top face 2110(*ii*).

Figure 8:
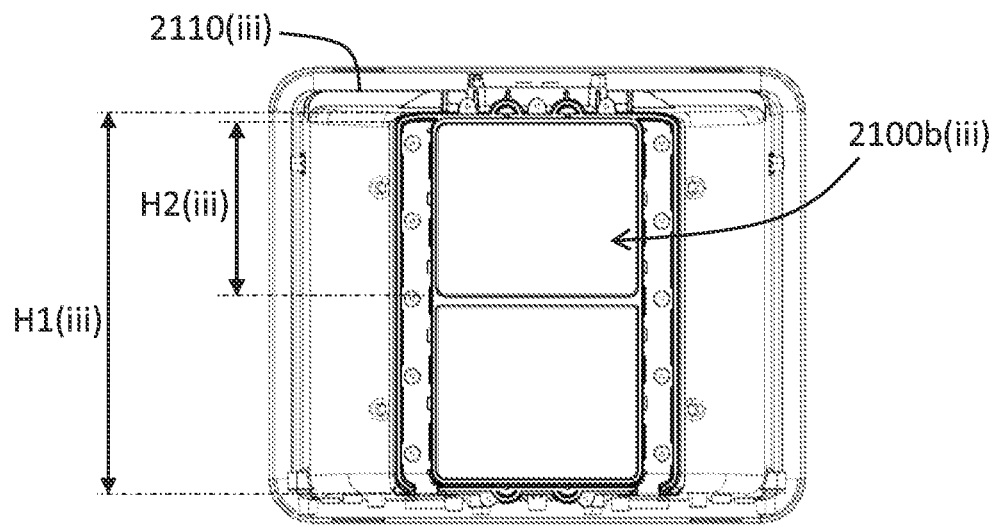
FIG. 8 is a rear view of a container body according to a further embodiment of the invention.

FIG. 8 is a rear view of a container body according to a further embodiment of the invention. In the embodiment of FIG. 8, the second height H2(*iii*) is about 50% of the first height H1(*iii*), and the back opening 2100*b*(*iii*) is in proximity to the top face 2110(*iii*).

Figure 9:
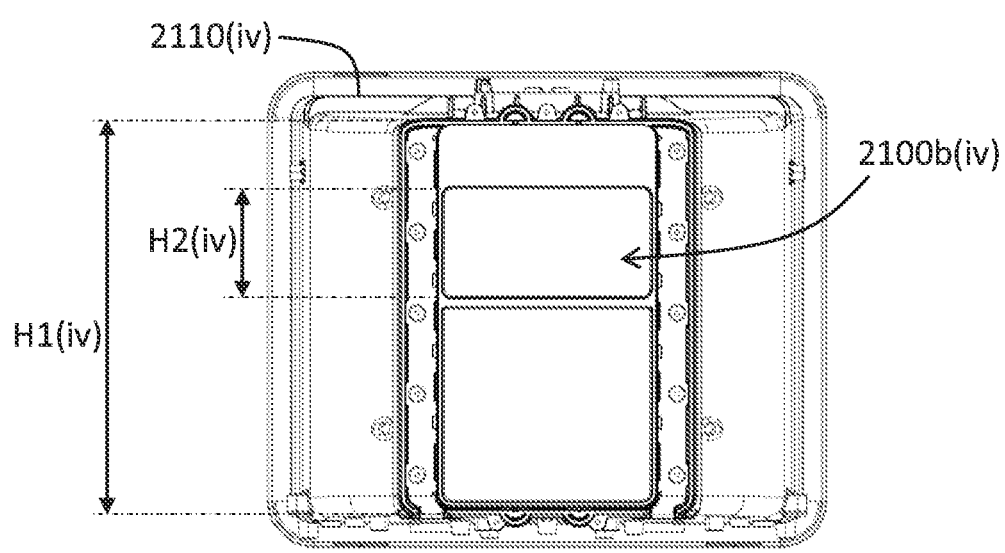
FIG. 9 is a rear view of a container body according to a different embodiment of the invention.

FIG. 9 is a rear view of a container body according to a different embodiment of the invention. In the embodiment of FIG. 9, the second height H2(*iv*) is about 20% of the first height H1(*iv*), and the back opening 2100*b*(*iv*) keeps a distance from the top face 2110(*iv*).

The above-mentioned embodiments relating to the first heights H1(*i*)-H1(*iv*) and the second heights H2(*i*)-H2(*iv*) are not for limiting the scope of the invention; on the contrary, as long as the second height H2 is about 10% to about 90% of the first height H1, the embodiments belong to the scope of the invention. Moreover, the back opening 2100*b* preferably situates in the location near the top face 2110, therefore while providing the purging gas, the flow rates of the purging gas are different at different heights, such feature will be more elaborated in below detail.

Figure 10:
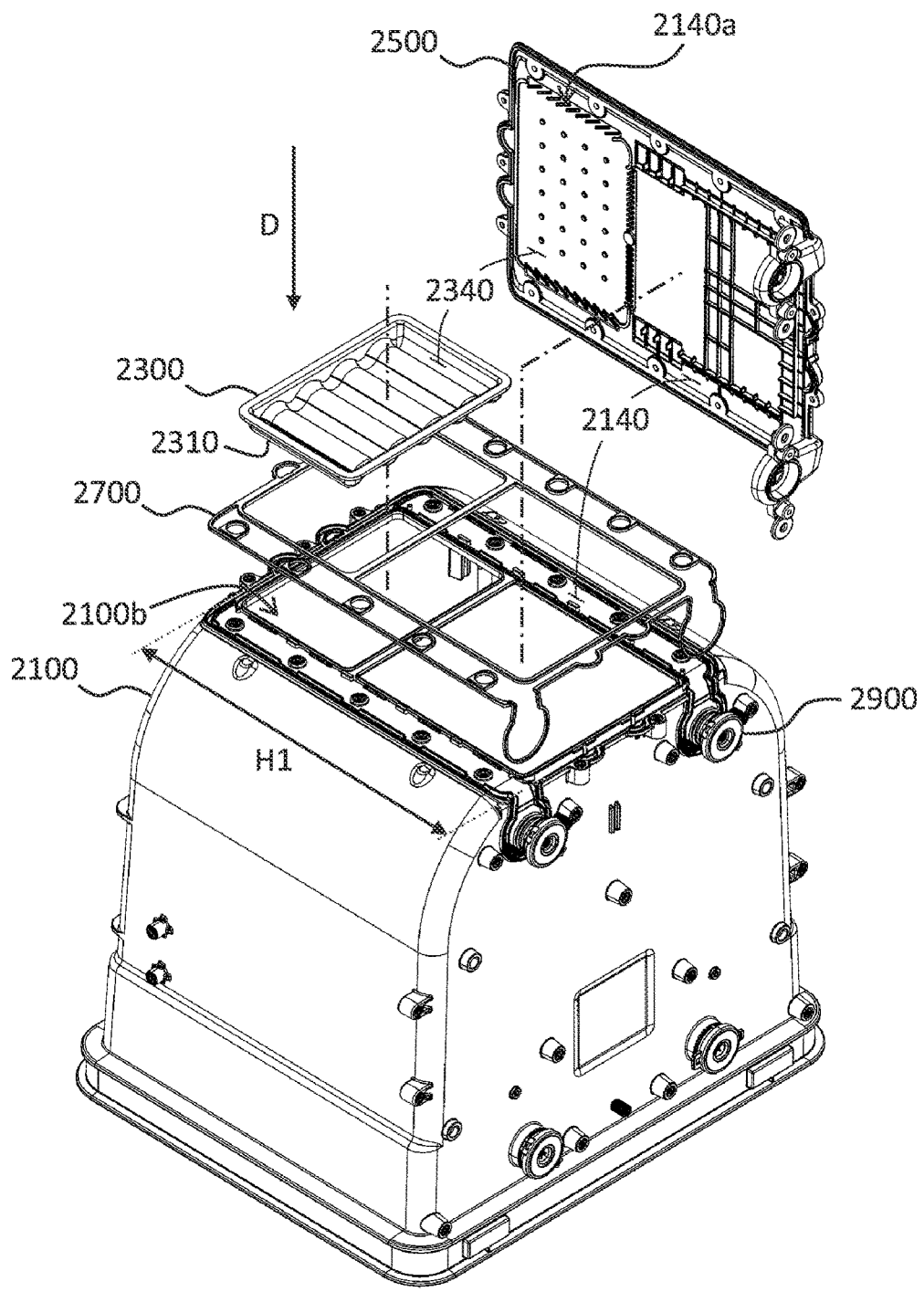
FIG. 10 is a schematic diagram showing the substrate container system of FIG. 1 before assembling.
Figure 11:
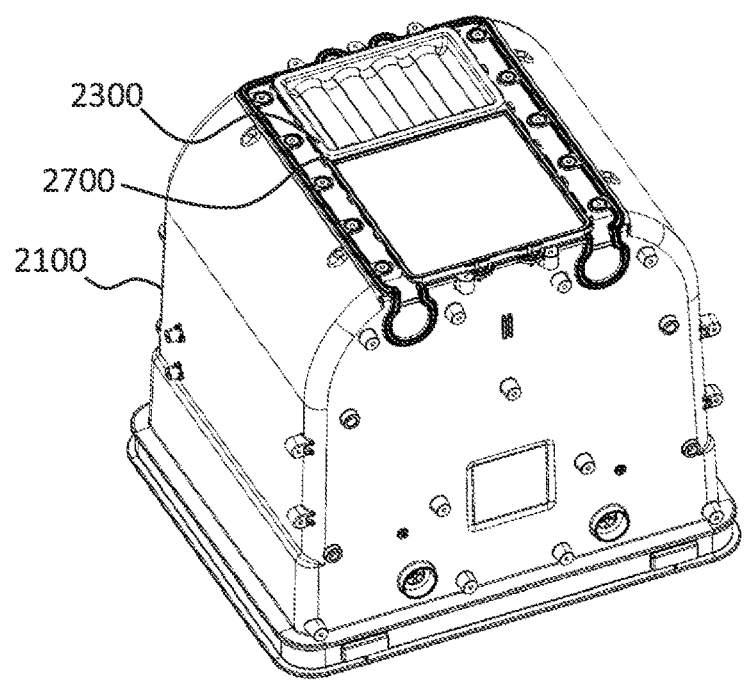
FIG. 11 is a schematic diagram showing the assembled container body, sealing member, and filter member of FIG. 1.
Figure 12:
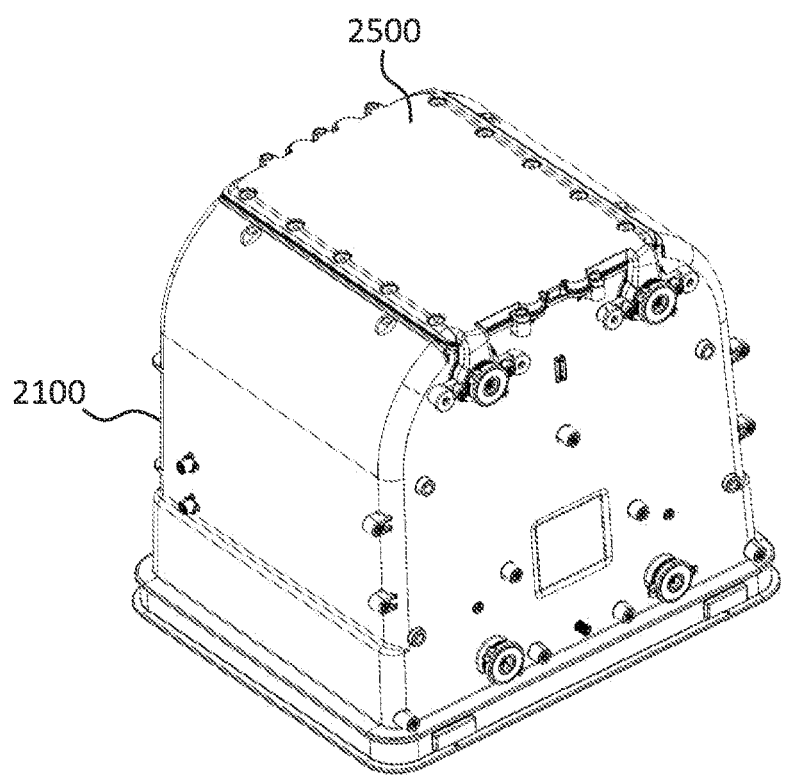
FIG. 12 is a schematic diagram showing the assembled substrate container system of FIG. 1.

Please refer to FIG. 10 to FIG. 12. FIG. 10 is a schematic diagram showing the substrate container system of FIG. 1 before assembling. FIG. 11 is a schematic diagram showing the assembled container body, sealing member, and filter member of FIG. 1. FIG. 12 is a schematic diagram showing the assembled substrate container system of FIG. 1. In the substrate container system 2000 of the present embodiment, the filter member 2300 covers the back opening 2100*b*. The back cover 2500 forms sealing engagement with the container body 2100. A gas guiding channel 2140 extending in a direction of the first height H1 is formed between the back cover 2500 and the container body 2100. The back cover 2500 and the filter member 2300 cooperatively define a buffering compartment 2340. The gas guiding channel 2140 has an outlet 2140*a* connecting the buffering compartment 2340.

After introducing into the substrate container system 2000, the purging gas enters the gas guiding channel 2140 from the bottom, diffuses upwardly along the direction of the first height H1, and then flows into the buffering compartment 2340 through the outlet 2140*a*. The filter member 2300 is made of a porous material; for example, made of a whole chunk of sintered porous material. The material includes but not limited to ceramic and polymer-based materials. When the purging gas enters the buffering compartment 2340 and accumulates to a designed pressure threshold (or called saturated pressure), the purging gas will permeate through the filter member 2300 evenly and maintain a stable pressure during the purging operation.

The filter member 2300 is preferably a plate structure and has a gas dispensing surface 2310 facing the internal space of the container body 2100. Through the plate structure design of the filter member 2300, comparing to other known types of filter members (such as a columnar gas diffusion tower), the plate structure filter member 2300 has larger internal space for gas under the same gas dispensing surface area size. Relatively, the columnar gas diffusion tower has a smaller internal space for gas. Additionally, the gas dispensing surface 2310 of the plate structure filter member 2300 generally faces toward and dispenses gas toward the internal space of the container body 2100, which helps to improve the purging efficiency. On the contrary, a portion of the gas dispensing surface of the known columnar gas diffusion tower faces backwardly from the internal space of the container.

Figure 13A:
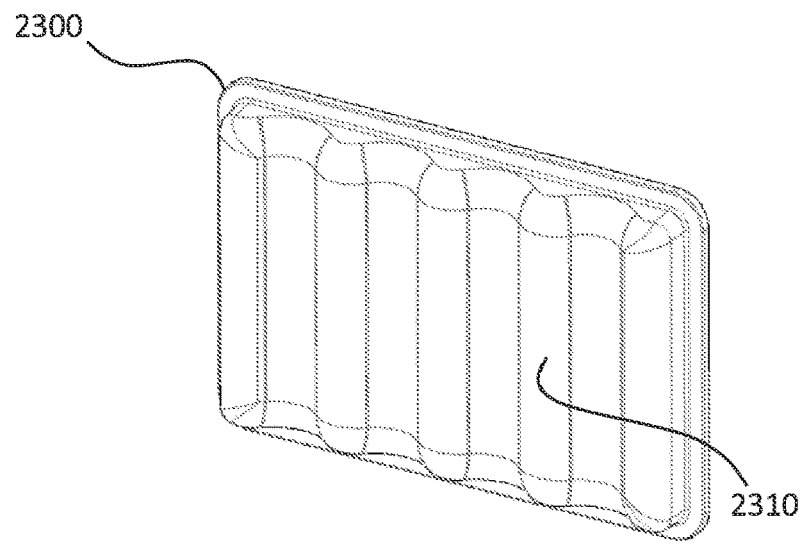
FIG. 13a is a three-dimensional view of the filter member of FIG. 1.
Figure 13B:
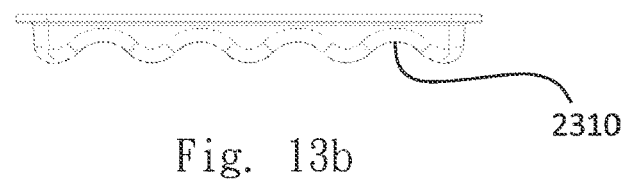
FIG. 13b is a side view of the filter member of FIG. 1.

Please refer to FIG. 1, FIG. 13a, and FIG. 13b, where FIG. 13a is a three-dimensional view of the filter member of FIG. 1, and FIG. 13b is a side view of the filter member of FIG. 1. The area of the gas dispensing surface 2310 of the filter member 2300 is larger than that of the back opening 2100b. The purging gas is dispensed uniformly through the gas dispensing surface 2310 and then enters the internal space of the container body 2100, so as to perform purging operation on the substrates. In the present embodiment, the gas dispensing surface 2310 has a wavy surface that includes multiple convex and concaves. The gas dispensing surface 2310 passes through the back opening 2100b and extends into the container body 2100 (e.g. along an extending direction D as shown in FIGS. 1 and 10), so that the area of the gas dispensing surface is increased, which is beneficial to the purging efficiency.

Figure 14A:
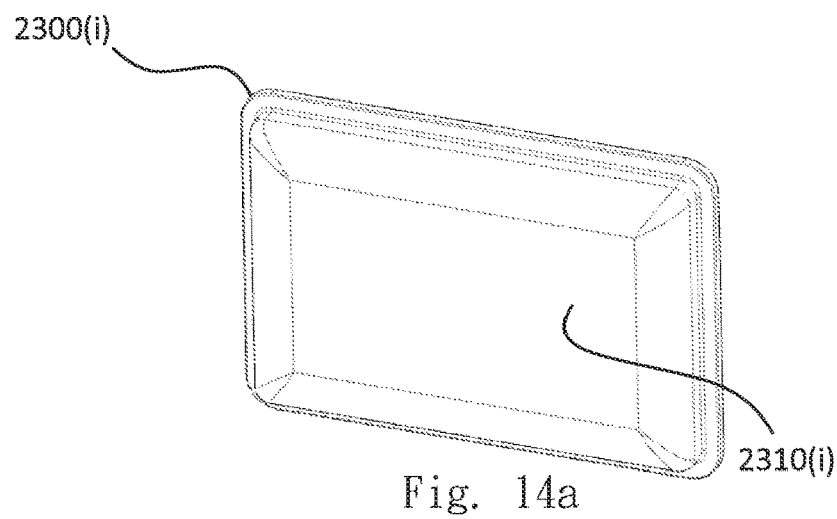
FIG. 14a is a three-dimensional view of a filter member according to another embodiment of invention.
Figure 14B:
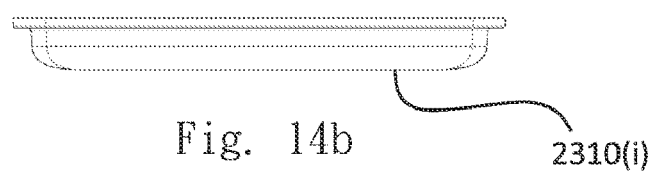
Figure 14C:
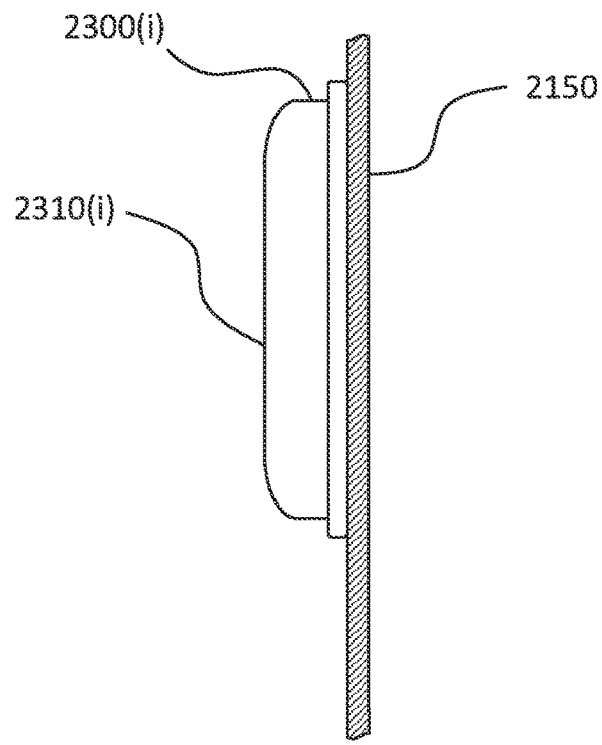
FIG. 14c is a schematic diagram of the filter member of FIG. 14b and the back plate.

Please refer to FIG. 14a and FIG. 14c, where FIG. 14a is a three-dimensional view of a filter member according to another embodiment of invention, FIG. 14b is a side view of the filter member of FIG. 14a, and FIG. 14c is a schematic diagram of the filter member of FIG. 14b and the back plate. The area size of the gas dispensing surface 2310(i) of the filter member 2300(i) is larger than that of the back opening 2100b. The purging gas is dispensed steadily and evenly through the gas dispensing surface 2310(i) and enters the internal space of the container body 2100 to perform purging operation on the substrate. In the present embodiment, the gas dispensing surface 2310(i) has a plane parallel to the back plate 2150, which facilitates the uniformity of dispensing the purging gas. The gas dispensing surface 2310(i) passes through the back opening 2100b and extends into the container body 2100 (e.g. along the extending direction D as shown in FIGS. 1 and 10), which is beneficial to the purging efficiency.

Figure 14D:
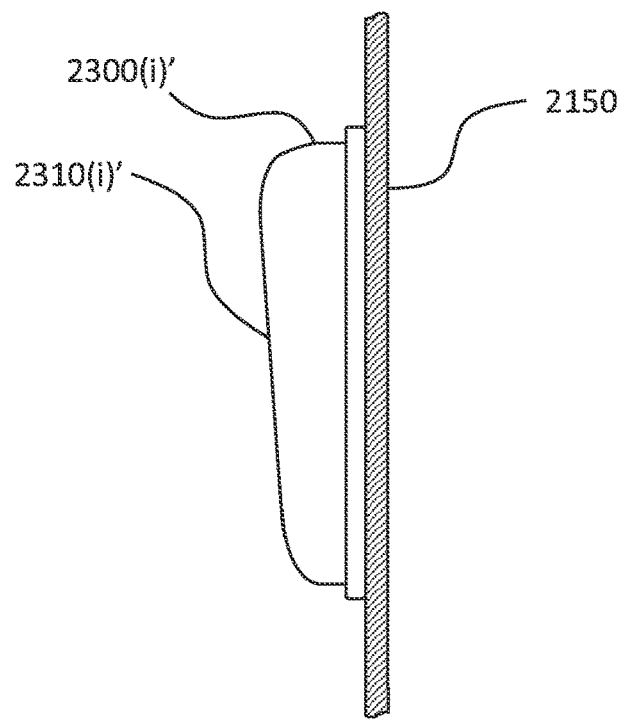
FIG. 14d is a schematic diagram of the filter member of and the back plate FIG. 14c according to another embodiment of the invention.

Please refer to FIG. 14d, which is a schematic diagram of the filter member and the back plate of FIG. 14c according to another embodiment of the invention. In a different embodiment, the gas dispensing surface 2310(i)' of the filter member 2300(i)' has a plane that forms an acute angle with the back plate 2150. As such, the plane is not parallel to the back plate 2150 and can be optionally inclined toward the top face 2110 or the bottom face 2130 of the container body 2100. The angle of dispensing the purging gas can therefore be adjusted. The acute angle formed between the plane of the filter member 2300(i)' and the back plate 2150 can be adjusted according to the requirement or specification of the product.

Figure 15A:
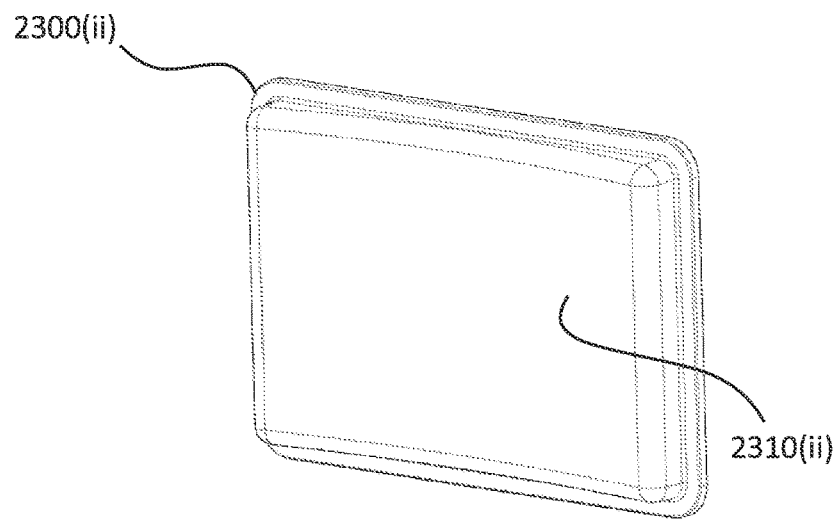
FIG. 15a is a three-dimensional view of a filter member according to another embodiment of the invention.
Figure 15B:
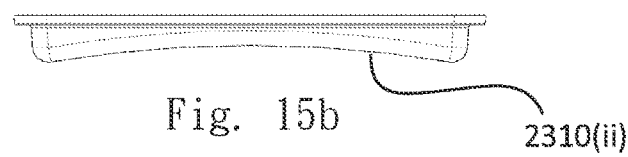

Please refer to FIG. 15a and FIG. 15b at the same time. FIG. 15a is a three-dimensional view of a filter member according to another embodiment of the invention, and FIG. 15b is a side view of the filter member of FIG. 15a. The area of the gas dispensing surface 2310(ii) of filter member 2300(ii) is larger than that of the back opening 2100b. The purging gas is dispensed steadily and evenly through the gas dispensing surface 2310(ii) and enters the internals space of the container body 2100, so as to perform the purging operation on the substrate. In the present embodiment, the gas dispensing surface 2310(ii) extends toward the back cover 2500 through the back opening 2100b (as in the opposite direction of the extending direction D shown in FIG. 1 and FIG. 10) and forms a curved profile which is in a concave state in the present embodiment. The area of the gas dispending surface 2310(ii) can be increased, and the efficiency of the purging operation can be increased accordingly.

Figure 16A:
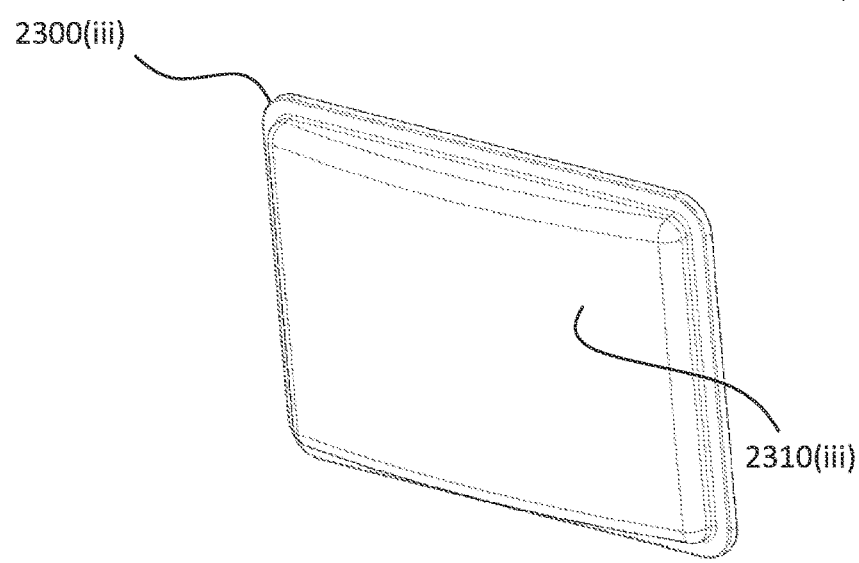
FIG. 16a is a three-dimensional view of a filter member according to yet another embodiment of the invention.
Figure 16B:
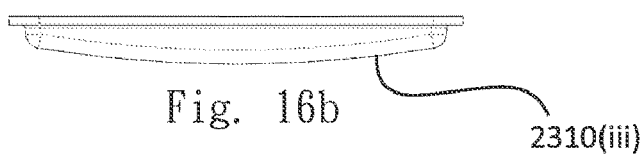

Please refer to FIG. 16a and FIG. 16b at the same time. FIG. 16a is a three-dimensional view of a filter member according to yet another embodiment of the invention, and FIG. 16b is a side view of the filter member of FIG. 16a. The area of the gas dispensing surface 2310(iii) of the filter member 2300(iii) is larger than that of the back opening 2100b. The purging gas is dispended steadily and evenly through the gas dispensing surface 2310(iii) and enters the internal space of the container body 2100, so as to perform the purging operation on the substrate. In the present embodiment, the gas dispensing surface 2310(iii) extends toward the container body 2100 through the back opening 2100b (as in the extending direction D shown in FIG. 1 and FIG. 10) and forms a curved profile which is a convex state in the present embodiment. The area of the gas dispensing surface 2310(iii) can be increased, and the efficiency of the purging operation can be increased accordingly.

Figure 17:
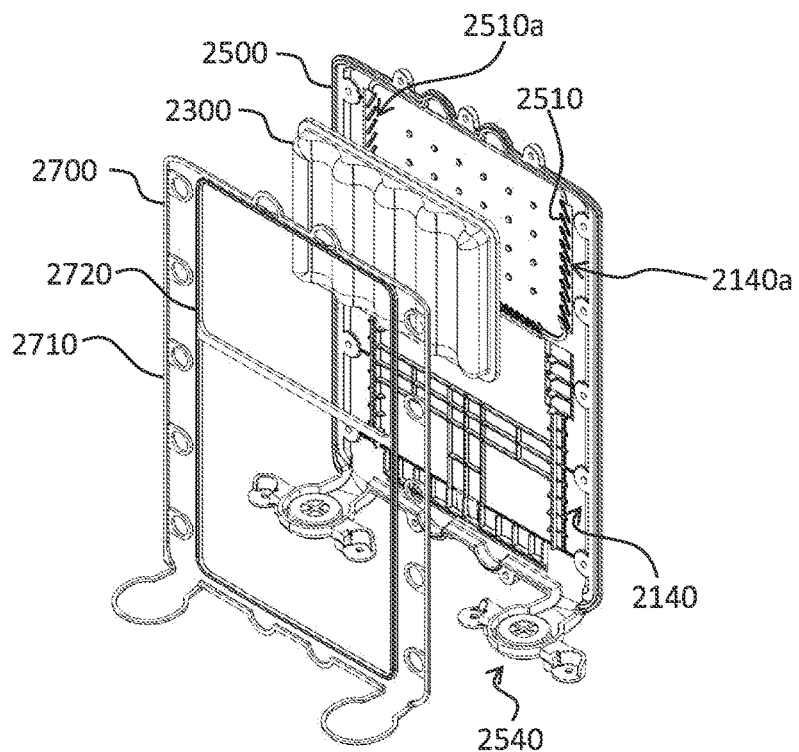
FIG. 17 is a schematic diagram showing the back cover, the filter member, and the sealing member of FIG. 1 before assembling.
Figure 18:
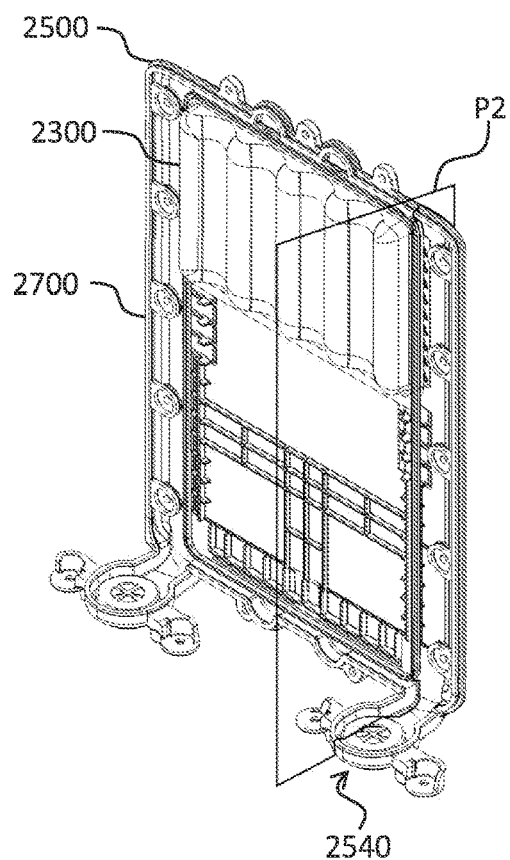
FIG. 18 is a schematic diagram showing the assembled back cover, filter member, and sealing member.
Figure 19:
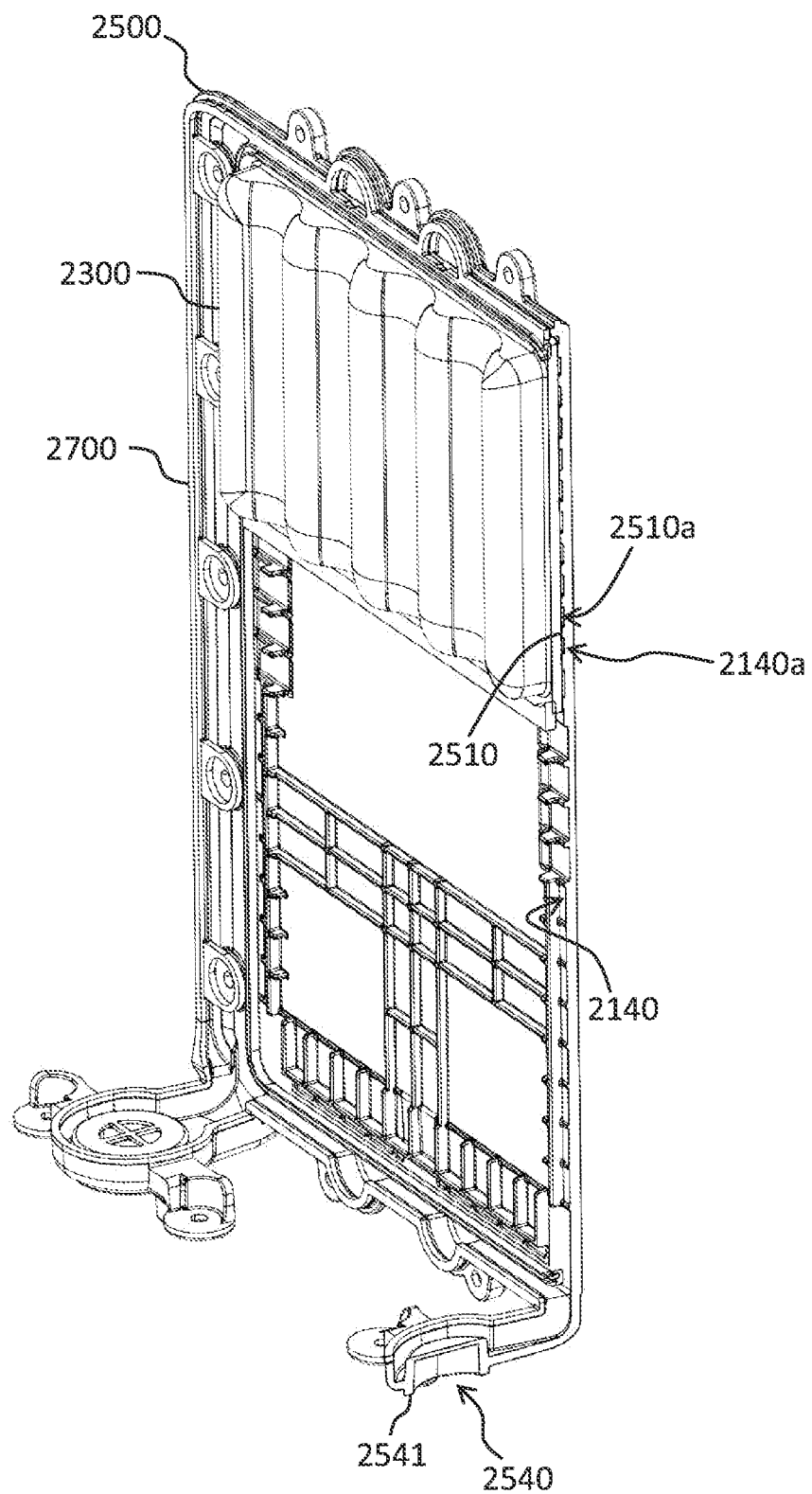
FIG. 19 is a cross-sectional view along section P2 of FIG. 18.

Next, please refer to FIGS. 17-19. FIG. 17 is a schematic diagram showing the back cover, the filter member, and the sealing member of FIG. 1 before assembling, FIG. 18 is a schematic diagram showing the assembled back cover, filter member, and sealing member, and FIG. 19 is a cross-sectional view along section P2 of FIG. 18. In the present embodiment, the back cover 2500 has numerous ribs 2510 protruding toward the container body 2100 (as in the extending direction D shown in FIG. 1 and FIG. 10) for abutting against the filter member 2300. The ribs 2510 are disposed intermittently to form numerous grooves 2510a that constitute a part of the outlet 2140a of the gas guiding channel 2140. The outlet 2140a of the gas guiding channel 2140 includes the grooves 2510a.

Please refer to FIG. 1, FIG. 10, and FIGS. 17-19. The substrate container system 2000 further includes a sealing member 2700 having a first seal ring portion 2710 and a second seal ring portion 2720. The first seal ring portion 2710 is arranged between the back cover 2500 and the container body 2100, and the second seal ring portion 2720 is arranged between the filter member 2300 and the container body 2100. The back cover 2300 establishes sealing engagement with the container body 2100 through the first seal ring portion 2710. The filter member 2300 establishes sealing engagement with the perimeter around the back opening 2100b of the container body 2100 through the second seal ring portion 2720. By the provision of the sealing member 2700 between the container body 2100 and the back cover 2500, the gas guiding channel 2140 between the two can be airtight and gas leakage can be prevented, thus ensuring that the purging gas enters the internal space of the container body 2100 only through the filter member 2300.

Figure 20:
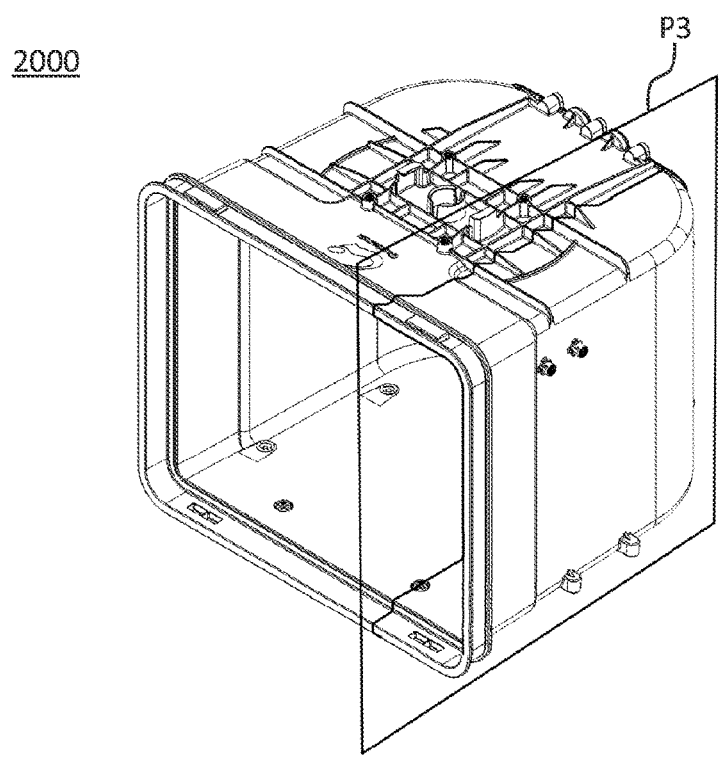
FIG. 20 is a schematic diagram of the substrate container system of FIG. 1 and section P3.
Figure 21:
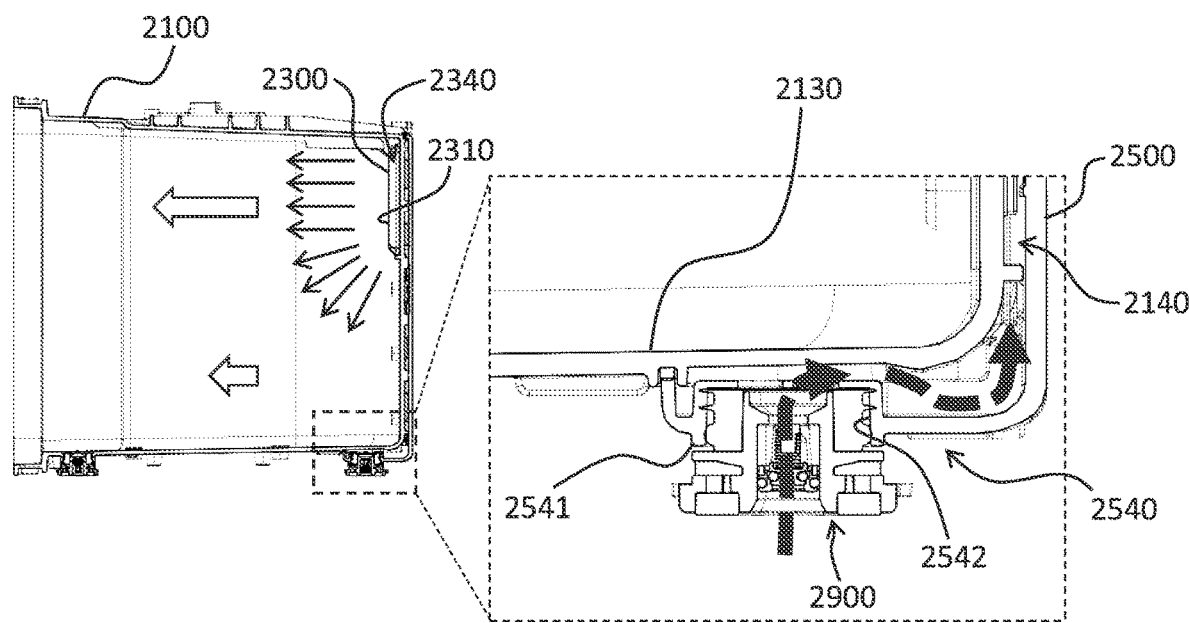
FIG. 21 is a cross-sectional view along section P3 of FIG. 20.

The entrance end where the purging gas enters the substrate container system 2000 will now be elaborated. Please refer to FIGS. 17-21. FIG. 20 is a schematic diagram of the substrate container system of FIG. 1 and section P3, and FIG. 21 is a cross-sectional view along section P3 of FIG. 20. The back cover 2500 of the substrate container system 2000 includes a gas inlet structure 2540 which is bendingly extending under the bottom face 2130 of the container body 2100. The gas inlet structure 2540 includes a gas intake port 2541 facing downwardly and opposing the bottom face 2130 of the container body for connecting to an external purging apparatus (not shown in the drawings). The gas inlet structure 2540 communicates with the gas guiding channel 2140. The substrate container system 2000 in the present embodiment has a pair of the gas inlet structure 2540 and a pair of the gas guiding channel 2140, and the pairs respectively located on two opposing sides of the back opening 2100*b*, as shown in FIG. 1 and FIG. 17.

The substrate container system 2000 further includes a valve assembly 2900 enabling passage of the purging gas. The gas intake port 2541 has a connecting structure 2542 through which the valve assembly 2900 is connected to the gas intake port 2541.

Please continue referring to FIG. 21. The purging gas enters the gas inlet structure 2540 through the valve assembly 2900, diffuses upwardly along the gas guiding channel 2140 (as shown by the thick dashed black arrow in FIG. 21), and then enters the buffering compartment 2340 through the outlet 2140*a* of the gas guiding channel 2140. Once reaching the saturated pressure, the purging gas will be dispensed steadily and evenly toward the internal space of the container body 2100. In the height direction of the container body 2100, the flow rate of the purging gas corresponding to the location of the filter member 2300 is higher than the flow rate in other portions; that is, the flow rates of the purging gas are different at different heights. In the embodiment of FIG. 21, the filter member 2300 locates on the upper portion of the container body 2100, so the flow rate of the purging gas at the upper portion of the container body 2100 is higher than that at the lower portion of the container body 2100 (as shown by the upper and lower hollow arrows in the container body 2100). Under the condition of the same purging gas flow rate, comparing to the uniformly full-surface distribution, the non-full-surface distribution of the present embodiment of the invention provides a higher flow rate at the upper portion than the flow rate at the lower portion. The external dusts, particles, or other contaminants carried by the air outside the front door that blows downwardly can be prevented from entering the container body 2100, and thus the cleanliness can be maintained and the humidity rising can be reduced.

Figure 22:
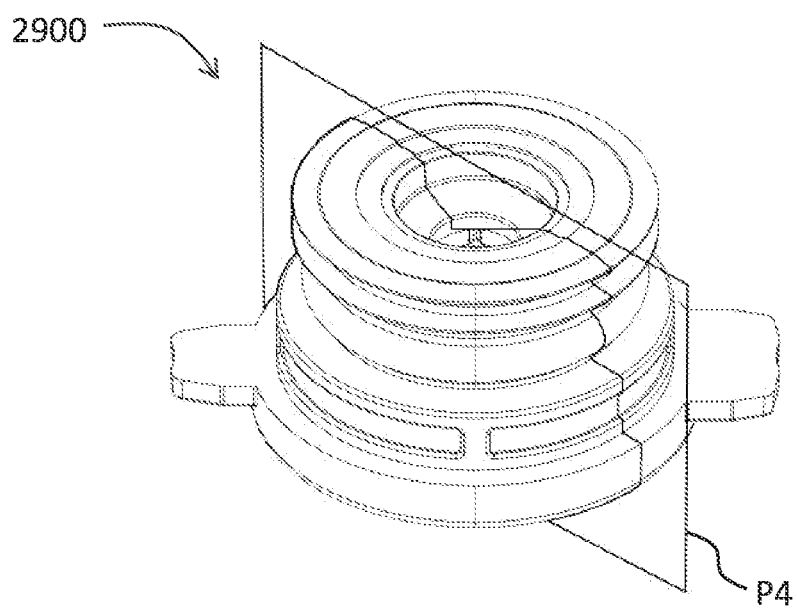
FIG. 22 is a three-dimensional view of a valve assembly according to one embodiment of the invention and section P4.
Figure 23:
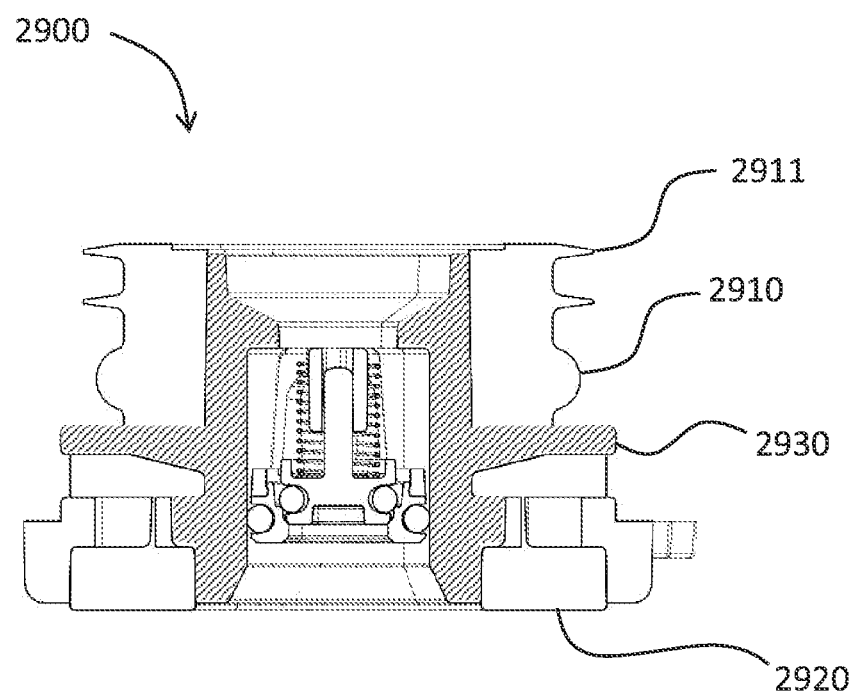
FIG. 23 is a cross-sectional view of the valve assembly along section P4 of FIG. 22.
Figure 24:
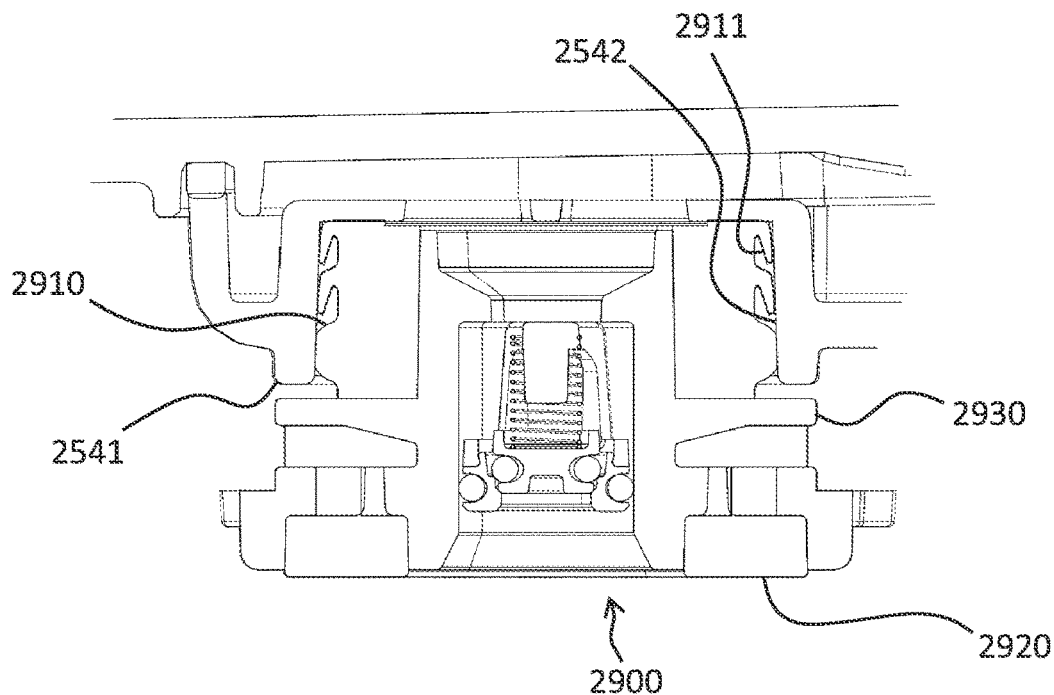
FIG. 24 is a schematic diagram showing the assembled valve assembly and gas intake port.

The valve assembly 2900 will now be elaborated. Please refer to FIGS. 22-24, where FIG. 22 is a three-dimensional view of a valve assembly according to one embodiment of the invention and section P4, FIG. 23 is a cross-sectional view of the valve assembly along section P4 of FIG. 22, and FIG. 24 is a schematic diagram showing the assembled valve assembly and gas intake port. The valve assembly 2900 includes a valve body 2930 and a first elastic material 2910. The first elastic material 2910 is disposed at one side of the valve body 2930. The first elastic material 2910 has a fin 2911 that deforms when the valve assembly 2900 is assembled with the connecting structure 2542 to establish sealing engagement with the connecting structure 2542.

In one embodiment of the present invention, the connecting structure 2542 is a socket for receiving the valve assembly 2900. The fin 2911 protrudes from the exterior surface of the first elastic material 2910 and extends a distance. When the valve assembly 2900 is assembled with the connecting structure 2542, the fin 2911 interferes with the connecting structure 2542 and bends (as shown in FIG. 24), so the fin 2911 can establish sealing engagement with the connecting structure 2542.

Figure 25:
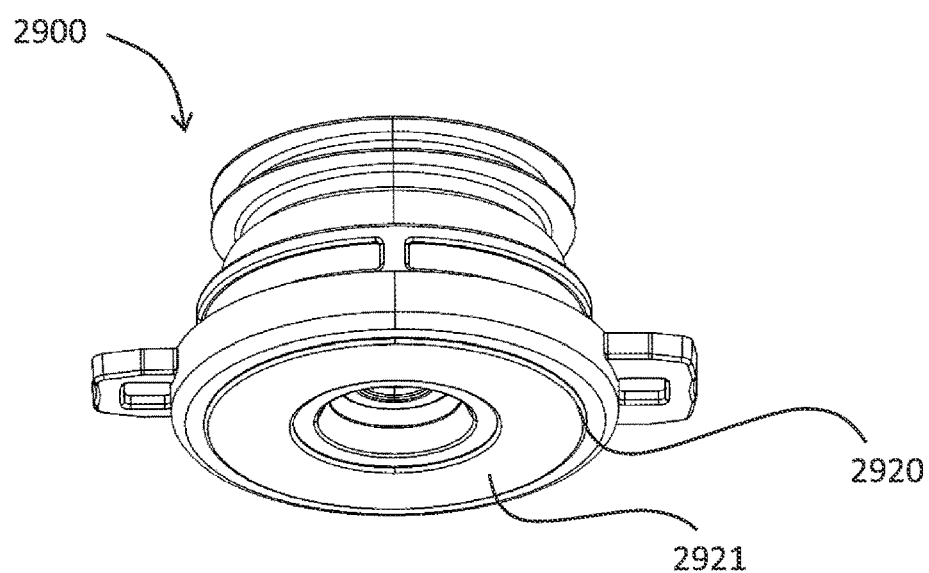
FIG. 25 is a three-dimensional view of the valve assembly of FIG. 22 from another angle.

Please refer to FIGS. 23-25, where FIG. 25 is a three-dimensional view of the valve assembly of FIG. 22 from another angle. The valve assembly 2900 further includes a second elastic material 2920 disposed at another side of the valve body 2930. The second elastic material 2920 has a docking surface 2921 for connecting to the external purging apparatus to establish sealing engagement. In the present embodiment, the first elastic material 2910 and the second elastic material 2920 are disposed on two opposing sides of the valve body 2930. The docking surface 2921 of the second elastic material 2920 is used for docking with the external purging apparatus, so gas leakage can be prevented, and the efficiency of the purging operation can be increased.

According to the previously mentioned embodiments of the present invention, the substrate container system including the container body, the filter member, and the back cover is provided. The container body has the top face, the bottom face, the back plate, the front opening, and the back opening. The bottom face opposes the top face. The back plate connects the top face and the bottom face and has a first height. The front opening is located between the top face and the bottom face, and the back opening opposes the front opening. The front opening enables passage of the substrate. The back opening is located on the back plate and has a second height smaller than the first height. The filter member covers the back opening. The back cover establishes sealing engagement with the container body. The gas guiding channel extending in the direction of the first height is formed between the back cover and the container body. The back cover and the filter member cooperatively define the buffering compartment. The gas guiding channel has the outlet connecting the buffering compartment. The back opening provides the purging gas in the partial, non-full-surface manner, so the flow rates of the purging gas are different at different heights. The outside contaminants such as dust, particles, moisture, or other contaminants will not enter the internal space of the container body with the air outside the front door, thus the cleanliness can be maintained and the humidity rising can be reduced.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

What is claimed is:

1. A substrate container system, comprising:
   a container body having a top face, a bottom face opposing the top face, a back plate of a first height connecting the top face and the bottom face, a front opening located between the top face and the bottom face, and a back opening opposing the front opening, wherein the front opening enables passage of a substrate and the back opening is located on the back plate and has a second height smaller than the first height;
   a filter member covering the back opening; and
   a back cover establishing sealing engagement with the container body, a gas guiding channel extending in a direction of the first height being formed between the back cover and the container body, the back cover and the filter member cooperatively defining a buffering compartment, the gas guiding channel having an outlet connecting the buffering compartment.

2. The substrate container system according to claim 1, wherein the second height is about 10% to about 90% of the first height.

3. The substrate container system according to claim 2, wherein the second height is about 10% to about 50% of the first height, and the back opening is in proximity to the top face.

4. The substrate container system according to claim 1, wherein the filter member has a gas dispensing surface whose area is larger than that of the back opening, and the gas dispensing surface has a plane parallel to the back plate.

5. The substrate container system according to claim 1, wherein the filter member has a gas dispensing surface whose area is larger than that of the back opening, and the gas dispensing surface has a plane forming an acute angle with the back plate.

6. The substrate container system according to claim 1, wherein the filter member has a gas dispensing surface whose area is larger than that of the back opening, and the gas dispending surface has a wavy surface.

7. The substrate container system according to claim 1, wherein the filter member has a gas dispensing surface whose area is larger than that of the back opening, and the gas dispensing surface extends towards the container body through the back opening and forms a curved profile.

8. The substrate container system according to claim 1, wherein the filter member has a gas dispensing surface whose area is larger than that of the back opening, and the gas dispensing surface extends towards the back cover through the back opening and forms a curved profile.

9. The substrate container system according to claim 1, wherein the back cover has a plurality of ribs protruding towards the container body for abutting against the filter member, and the ribs are disposed intermittently to form a plurality of grooves that constitute a part of the outlet of the gas guiding channel.

10. The substrate container system according to claim 1, further comprising:
a sealing member having a first seal ring portion and a second seal ring portion, wherein the first seal ring portion is arranged between the back cover and the container body, and the second seal ring portion is arranged between the filter member and the container body.

11. The substrate container system according to claim 1, wherein the back cover comprises:
a gas inlet structure bendingly extending under the bottom face of the container body, wherein the gas inlet structure comprises a gas intake port facing downwardly and opposing the bottom face of the container body for connecting an external purging apparatus.

12. The substrate container system according to claim 11, further comprising:
a valve assembly enabling passage of a purging gas, wherein the gas intake port has a connecting structure through which the valve assembly is connected to the gas intake port.

13. The substrate container system according to claim 12, wherein the valve assembly comprises:
a valve body; and
a first elastic material disposed at one side of the valve body, wherein the first elastic material has a fin that deforms when the valve assembly is assembled with the connecting structure to establish sealing engagement with the connecting structure.

14. The substrate container system according to claim 13, wherein the valve assembly further comprises:
a second elastic material disposed at another side of the valve body, wherein the second elastic material has a docking surface for connecting to the external purging apparatus to establish sealing engagement.

* * * * *